United States Patent
Domes

(10) Patent No.: US 8,228,113 B2
(45) Date of Patent: Jul. 24, 2012

(54) POWER SEMICONDUCTOR MODULE AND METHOD FOR OPERATING A POWER SEMICONDUCTOR MODULE

(75) Inventor: Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 75 days.

(21) Appl. No.: 12/914,301

(22) Filed: Oct. 28, 2010

(65) Prior Publication Data
US 2011/0102054 A1    May 5, 2011

(30) Foreign Application Priority Data
Oct. 30, 2009  (DE) .................. 10 2009 046 258

(51) Int. Cl.
*H03K 17/687* (2006.01)
(52) U.S. Cl. .................. 327/427; 327/436; 327/437
(58) Field of Classification Search .................. 327/419, 327/424, 426, 427, 434, 436, 437
See application file for complete search history.

(56) References Cited

U.S. PATENT DOCUMENTS

| | | | |
|---|---|---|---|
| 6,614,281 B1* | 9/2003 | Baudelot et al. | 327/321 |
| 7,245,175 B2* | 7/2007 | Morita | 327/427 |
| 2009/0009232 A1* | 1/2009 | Helfrich et al. | 327/430 |
| 2010/0103574 A1* | 4/2010 | Morrish | 361/58 |

* cited by examiner

*Primary Examiner* — An Luu
(74) *Attorney, Agent, or Firm* — Murphy, Bilak & Homiller, PLLC

(57) ABSTRACT

A power semiconductor module includes a normally on, controllable first power semiconductor switch including at least one first power semiconductor chip, and a normally off, controllable second power semiconductor switch including at least one second power semiconductor chip. The load paths of the first power semiconductor switch and of the second power semiconductor switch are connected in series. The control terminals of all first power semiconductor chips are permanently electrically conductively connected to a conductor track to which no load terminal of any of the first power semiconductor chips is permanently electrically conductively connected, and to which no load terminal and no control terminal of any of the second power semiconductor chips are permanently electrically conductively connected.

13 Claims, 8 Drawing Sheets

POWER SEMICONDUCTOR MODULE AND METHOD FOR OPERATING A POWER SEMICONDUCTOR MODULE

PRIORITY CLAIM

This application claims priority from German Patent Application No. 10 2009 046 258.9 filed on 30 Oct. 2009, said German Patent Application incorporated herein by reference in its entirety.

FIELD OF THE INVENTION

The invention relates to a power semiconductor module and a method for operating a power semiconductor module.

BACKGROUND

Power semiconductor modules comprise one or a plurality of power semiconductor switches. The advances in the power semiconductor materials with a high band gap that are used for the power semiconductor switches allow the production of unipolar components for high reverse voltages (e.g. 1200 V) such as would be possible in silicon (Si) only with high on resistances being accepted. Unipolar transistors that stand out include junction field effect transistors (JFETs), for example, particularly those whose semiconductor body comprises the semiconductor basic material silicon carbide. They have a high blocking capability in conjunction with fast switching behavior.

FIG. 1 shows a circuit symbol of a junction field effect transistor J1. The junction field effect transistor J1 has a first load terminal 11, a second load terminal 12 and also a control terminal 13. A load path is formed between the first load terminal 11 and the second load terminal 12, which load path can be driven by the control terminal 13, such that the load path is fully or partly turned on, or else turns off fully. Hereafter, a semiconductor component or a circuit arrangement is referred to as "in the off state" if its load path turns off. Accordingly, a semiconductor component or a circuit arrangement is referred to as "in the on state" if its load path turns on.

In the case of the junction field effect transistor J1 shown, the first load terminal 11 forms the drain terminal, and the second load terminal 12 forms the source terminal. The control terminal 13 is also referred to as the gate terminal. Furthermore, the junction field effect transistor J1 can have an optional body diode 14 integrated into its semiconductor body.

In this case, the load path is driven by a suitable electrical drive potential being applied to the control terminal 13. This can be effected, for example, by means of a control voltage between the control terminal 13 and the second load terminal 12. If the control voltage is equal to or almost zero, then the load path is in the on state. In order to put the load path into the off state, the control terminal 13 has to be sufficiently negatively biased relative to the second load terminal 12, such that the current channel in the semiconductor is fully pinched off. The junction field effect transistor J1 is therefore also referred to as normally on.

A normally on behavior is not always desirable, however, from the point of view of the user. Therefore, in many applications, rather than normally on junction field effect transistors, normally off transistors are used such as e.g. enhancement-mode MOSFETs or IGBTs, that is to say transistors whose load paths are switched off without an external voltage being applied between the control terminal and the source or gate terminal.

Only significantly lower reverse voltages can be achieved with the normally off unipolar transistors available nowadays, however, in comparison with junction field effect transistors based on silicon carbide. Secondly, the bipolar transistors available nowadays have poorer dynamic properties.

SUMMARY

According to an embodiment of a power semiconductor module, the module includes a normally on, controllable first power semiconductor switch, which includes one or a plurality of first power semiconductor chips electrically connected in parallel, each of which has a first load terminal, a second load terminal, and a control terminal and also a load path formed between the first load terminal and the second load terminal of the relevant first power semiconductor chip.

The first power semiconductor switch has a load path formed by the parallel circuit composed of the load paths of the first power semiconductor chips. The power semiconductor module further includes a normally off, controllable second power semiconductor switch, which includes one or a plurality of second power semiconductor chips electrically connected in parallel, each of which has a first load terminal, a second load terminal, and also a control terminal, and also a load path formed between the first load terminal and the second load terminal of the relevant second power semiconductor chip.

The second power semiconductor switch has a load path formed by the parallel circuit composed of the load paths of the second power semiconductor chips. A circuit carrier includes an insulation carrier having a top side and an upper metallization layer applied to the top side, the metallization layer being structured to form conductor tracks. All first power semiconductor chips are arranged on a first one of the conductor tracks. All second power semiconductor chips are arranged on a second one of the conductor tracks.

The load paths of the first power semiconductor switch and of the second power semiconductor switch are electrically connected in series. The control terminals of all first power semiconductor chips are permanently electrically conductively connected to a third one of the conductor tracks. None of the first load terminals and none of the second load terminals of the first power semiconductor chips are permanently electrically conductively connected to the third conductor track. None of the first load terminals, none of the second load terminals and none of the control terminals of the second power semiconductor chips are permanently electrically conductively connected to the third conductor track. The second load terminals of the second power semiconductor chips are permanently electrically conductively connected to a fourth one of the conductor tracks.

According to another embodiment of a power semiconductor module, the module includes a normally on, controllable first power semiconductor switch including a plurality of first power semiconductor chips, and a normally off, controllable second power semiconductor switch including a plurality of second power semiconductor chips. Load paths of the first power semiconductor switch and of the second power semiconductor switch are connected in series. Control terminals of the first power semiconductor chips are permanently electrically conductively connected to a conductor track to which no load terminal of any of the first power semiconductor chips is permanently electrically conductively connected and to which no load terminal and no control terminal of any of the second power semiconductor chips are permanently electrically conductively connected.

According to an embodiment of a method for operating a power semiconductor module, the method includes providing a power semiconductor module as described in the preceding paragraph and driving the control terminals of the second power semiconductor chips such that the load path of each of the second power semiconductor chips is permanently in an on state during a time interval in which a changeover switching operation mode of all first power semiconductor chips is carried out. The changeover switching operation mode includes at least one switch-on process in which the load path of each of the first power semiconductor chips is switched from an off state to an on state, and at least one switch-off process in which the load path of each of the first power semiconductor chips is switched from an on state to an off state.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

With regard to the following description it should be taken into consideration that, in the case of the different exemplary embodiments, identical or identically acting functional elements or structures or semiconductor zones have the same reference symbols and the descriptions of these functional elements or structures or semiconductor zones in the different exemplary embodiments illustrated below are mutually interchangeable. The features of the different exemplary embodiments described herein can be combined with one another, unless mention is made specifically to the contrary.

Figure 1:
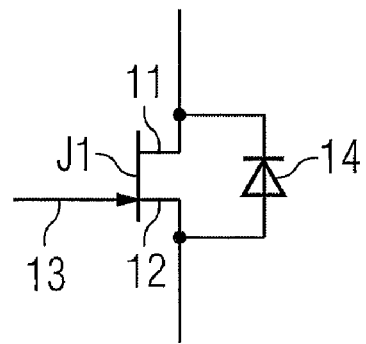
FIG. 1 shows a circuit symbol of a junction field effect transistor.
Figure 2:
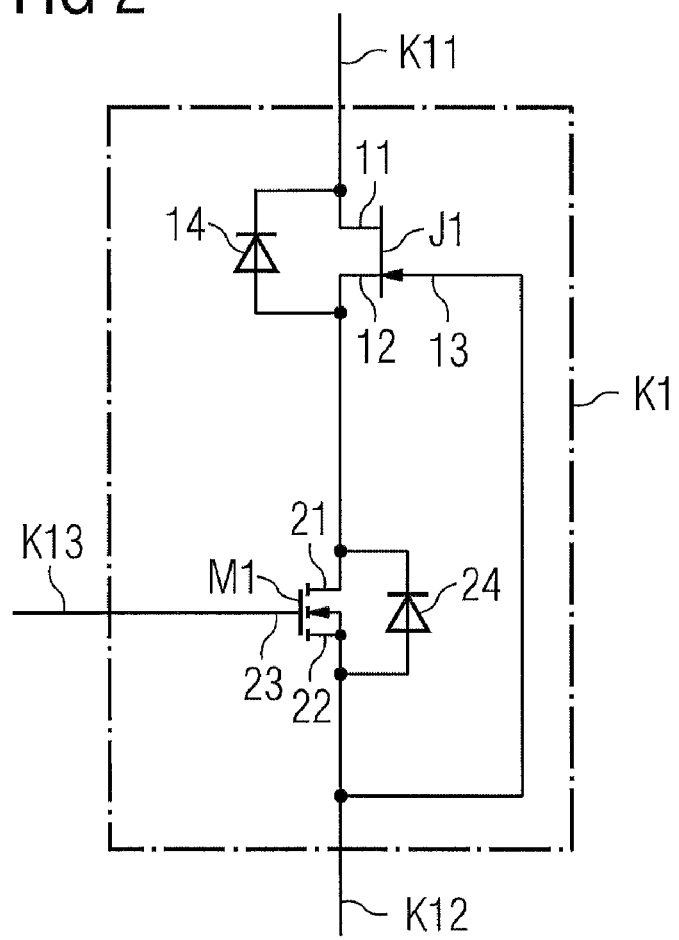
FIG. 2 shows a circuit arrangement.

FIG. 2 shows a circuit arrangement K1. Circuit K1 comprises a normally on, controllable first power semiconductor switch J1 such as has been explained with reference to FIG. 1, and also a normally off, controllable second power semiconductor switch M1. The second power semiconductor switch M1, which is embodied as a MOSFET, by way of example, has a first load terminal 21, a second load terminal 22 and also a control terminal 23. Moreover, the MOSFET M1 has an optional body diode 24 integrated into its semiconductor body. A load path is formed between the first load terminal 21 and the second load terminal 22, which load path can be turned on by an electrical control potential being applied to the control terminal 23, such that the load path is in a fully or partly turned on state or a fully turned off state.

The load paths of the junction field effect transistor J1 and of the MOSFET M1 are electrically connected in series by the second load terminal 12 of the junction field effect transistor J1 being electrically connected to the first load terminal 21 of the MOSFET M1. Within the meaning of the present application, the expressions "electrically connected", "electrically conductively connected" can be understood, inter alia, such that there is a direct electrical connection without the interposition of a switching semiconductor element, and that the direct electrical connection is embodied with very low resistance and e.g. permanently has an electrical resistance of less than 1 ohm. Inter alia, metallic components such as e.g. conductor tracks, connection plates, etc. are regarded as electrical connections. In this case, a plurality of such components are also regarded as "electrical connection" if they are conductively connected to one another for example by soldering, electrically conductive adhesive bonding, pressure sintering or by pressure contact-connection.

The circuit arrangement K1 forms a controllable power semiconductor switch having a first load terminal K11, a second load terminal K12 and a control terminal K13. Between its first load terminal K11 and its second load terminal K12, the circuit arrangement K1 has a controllable load path formed by the series circuit composed of the load paths of the junction field effect transistor J1 and of the MOSFET M1. Moreover, the control terminal 13 of the junction field effect transistor J1 is electrically connected to the second load terminal 22 of the MOSFET M1.

The load path of the circuit arrangement K1 can be driven solely by an external electrical control potential being applied to its control terminal K13, which is connected to the control terminal 23 of the MOSFET M1. External driving of the control terminal 13 of the junction field effect transistor J1 is not provided. On account of the integration of the junction field effect transistor J1 and the MOSFET M1, the drain-source voltage of the MOSFET M1 corresponds to the negative gate-source voltage of the junction field effect transistor J1. In order to turn off, the junction field effect transistor J1 requires a negative gate-source voltage. In the switched-on state, the MOSFET M1 forces the gate-source voltage of the junction field effect transistor J1—apart from a very small voltage drop across the load path of the MOSFET M1 and low-resistance connection lines—to a value close to zero, such that the junction field effect transistor J1 is also in the switched-on state or is switched on.

Figure 3:
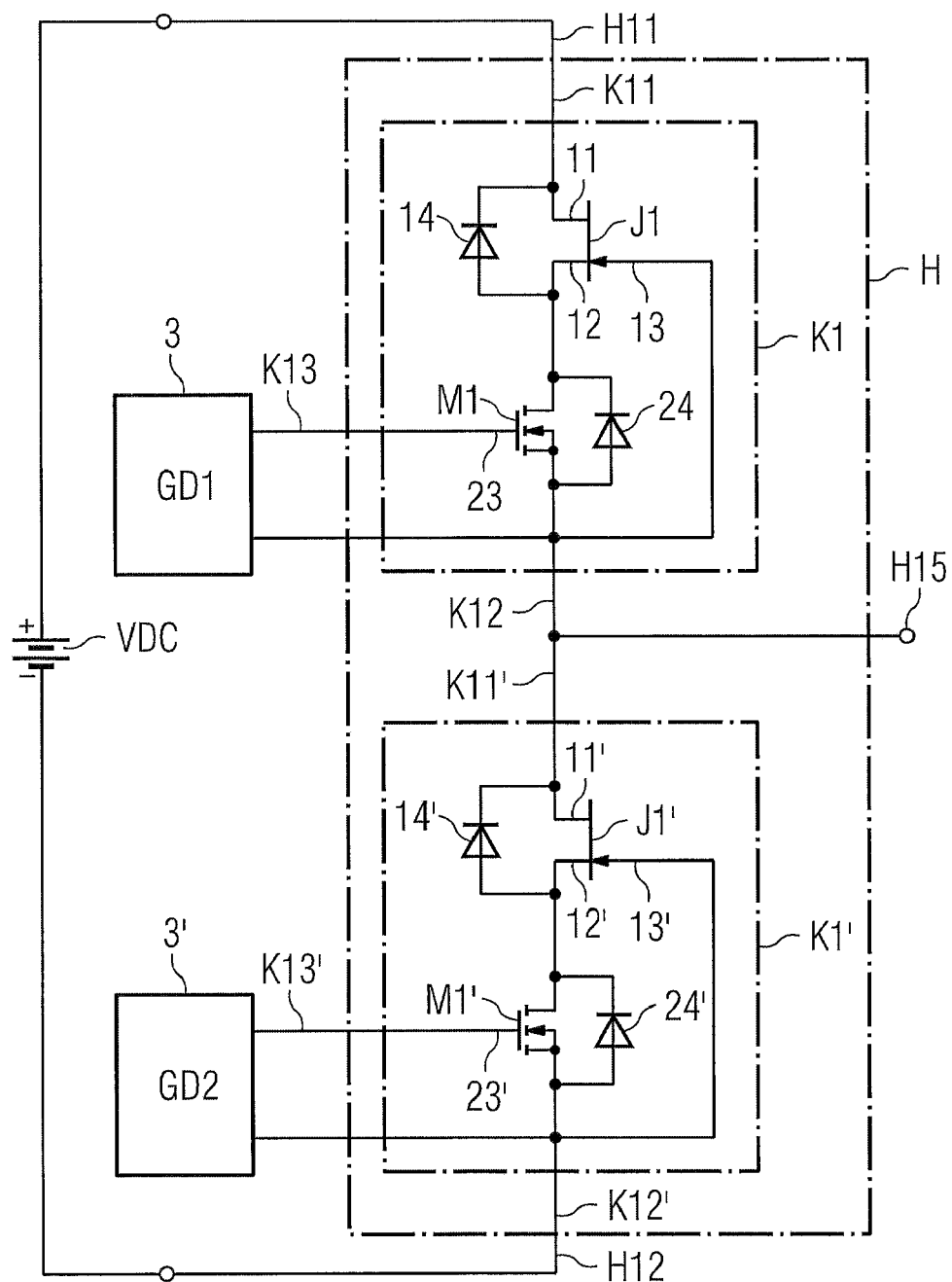
FIG. 3 shows an inverter circuit arrangement.

A broad field of application of power electronics is inverted circuits (inverters, converters). A single-phase inverter stage H, which is also referred to hereinafter as a half-bridge, is shown in FIG. 3. The half-bridge H comprises an upper circuit arrangement K1 and a lower circuit arrangement K1', which can in each case be constructed like a circuit arrangement explained with reference to FIG. 2. The load paths of the circuit arrangements K1 and K1' are connected in series by the second load terminal K12 of the upper circuit arrangement K1 being connected to the first load terminal K11' of the lower circuit arrangement K1'. Moreover, the half-bridge H has a phase output H15, which is connected to the second load terminal K12 of the upper circuit arrangement K1 and to the first load terminal K11' of the lower circuit arrangement K1'.

If a supply voltage VDC is connected to the half-bridge H between the first load terminal H11 thereof and the second load terminal H12 thereof, such that the first load terminal H11 has an electrical potential that is positive relative to the second load terminal H12, then the potential present at the first load terminal H11 can be switched through to the phase output H15 by the load path of the upper circuit arrangement K1 being switched on and the load path of the lower circuit arrangement K1' being switched off. The potential present at the second load terminal H12 can correspondingly be switched through to the phase output H15 by the load path of the upper circuit arrangement K1 being switched off and the load path of the lower circuit arrangement K1' being switched on. Instead of the supply voltage from a DC voltage source as shown in FIG. 3, it is also possible, for example, to provide an intermediate circuit voltage generated by the rectification of a two-, three- or polyphase AC voltage.

For driving the upper circuit arrangement K1, an upper driver circuit 3 connected to the control input K13 thereof is provided. The lower circuit arrangement K1' is correspondingly driven by means of a lower driver circuit 3' connected to its control input K13'.

In the half-bridge H, both positive and negatively directed currents are permitted via the phase output H15. Consequently, it is necessary that the circuit arrangements K1 and K1' can also carry current in the reverse direction in specific situations. In this case, current in the reverse direction is considered to be a current whose technical current direction is directed from the second load terminal K12 or K12' of the relevant circuit arrangement K1 or K1', respectively, to the first load terminal of the associated circuit arrangement K1 or K1', respectively.

If, in the case of a reverse conducting circuit arrangement K1 or K1', the MOSFET thereof is switched on, the reverse current can flow through the channel of the MOSFET. The drain-source voltage of the MOSFET is then slightly negative, such that the junction field effect transistor of the reverse conducting circuit arrangement K1 or K1' is switched on and the reverse current can also flow through the channel of the transistor.

During the normal switching operation mode of a converter circuit, the upper circuit arrangement K1 and the lower circuit arrangement K1' of the half-bridge H are alternately switched on and off, with the secondary condition that only ever at most one of the circuit arrangements K1 and K1' is switched on. Since the controllable power semiconductor switches J1, K1, J1', K1' do not permit arbitrarily high switching speeds on account of stored charges and component-internal capacitances, a switch-off signal of one circuit arrangement K1, K1' cannot be followed by the switch-on signal of the other circuit arrangement K1' or K1 without the occurrence of a delay. Between the switch-off signal of one circuit arrangement K1, K1' and the succeeding switch-on signal of the other circuit arrangement K1' or K1, therefore, a predetermined dead time has to be complied with, which can be in the range of a few 10 ns through to a few µs.

During the dead time, both circuit arrangements K1 and K1' are switched off. For the reverse conducting circuit arrangement K1 or K1' this means that, at the beginning of the dead time, the reverse current through the channel of the MOSFET M1 or M1' of the switching-off circuit arrangement K1 or K1', respectively, commutates to the body diode 14 or 14' of the MOSFET M1 or M1', respectively. By contrast, the channel of the junction field effect transistor J1 or J1' of the switching-off circuit arrangement K1 or K1', respectively, still remains conducting.

If the non-reverse conducting circuit arrangement K1' or K1 is switched on at the end of the dead time, then the inductively driven phase current through the phase output H15 immediately commutates to the circuit arrangement. The until then reverse conducting circuit arrangement K1 or K1' is now currentless and now (almost) no voltage is dropped across it either. The voltage is still present (almost) completely at the load path of the circuit arrangement now carrying current. In order that the previously reverse conducting circuit arrangement can take up voltage, its output capacitance has to be charged from the supply voltage VDC dropped across the load path of the half-bridge H.

The output capacitance of a circuit arrangement K1, K1' is determined, inter alia, by the sum of the effective, voltage-dependent parasitic component capacitances. The faster the output capacitance is charged, the faster voltage can decrease across the load path of the now forward conducting circuit arrangement K1 or K1', that is to say that the higher the output capacitance of a circuit arrangement K1, K1', the lower the achievable rates of voltage rise and hence the greater the switching losses, and vice versa.

High output capacitances paired with high parasitic inductances in the system can thus lead to a limiting of the switching speeds. For the purposes of extremely low switching losses, fast charging of the output capacitance is desirable. An additional factor is that this capacitive current, in its mesh, is superposed on the phase current in the presently switched-on switch. This gives rise to additional switching losses in the latter.

Parasitic inductances such as typically occur when using intermediate circuit capacitors (the latter are normally connected to the supply voltage VDC in parallel with the half-bridge H, but are not illustrated in FIG. 3) and intermediate circuit busbar arrangements, and also on account of internal connection lines within the housing of a power semiconductor module in which a circuit arrangement K1 and/or K1' is arranged, limit the achievable rates of current rise.

For the purposes of the highest possible rates of voltage rise and the lowest possible switching losses, therefore, fast charging of the output capacitance of the circuit arrangements K1 and K1' involved is desirable. If the output capacitance of a circuit arrangement K1, K1' is charged in the off state of the latter, then it has to be discharged again in order to switch on this circuit arrangement K1, K1'. This is done by the power semiconductor switches J1, M1 or J1', M1' of the relevant circuit arrangement K1, K1' being turned on and in the process short-circuiting their own parasitic output capacitances. The energy previously stored in the output capacitances is then converted into heat.

It becomes clear from these considerations that a lowest possible output capacitance is desirable for rapidly proceeding, low-loss switching processes.

Figure 4A:
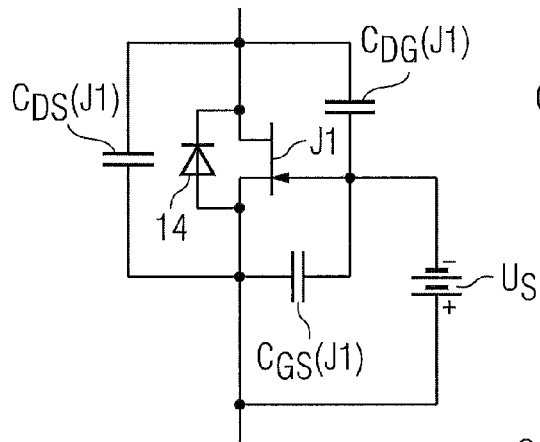
FIG. 4A shows a junction field effect transistor switched off by a separate voltage source.
Figure 4B:
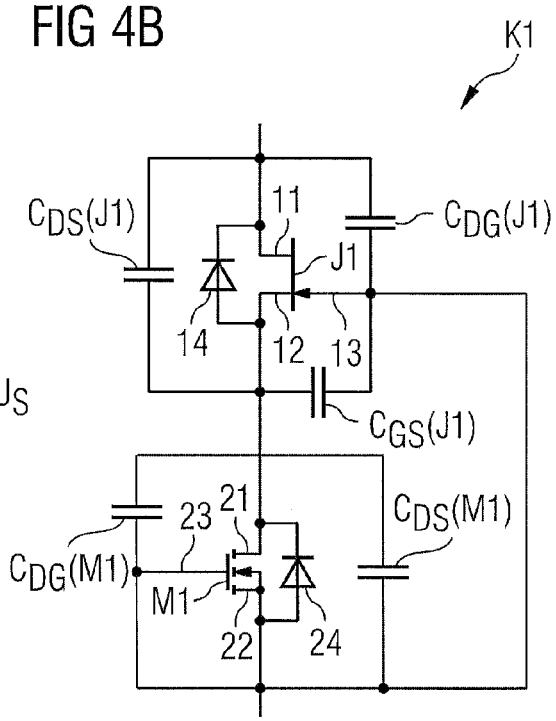
FIG. 4B shows a circuit arrangement switched off via a MOSFET.

FIG. 4A shows a junction field effect transistor J1 that is switched off by a separate voltage source $U_S$ (realized by the driver circuit 3 in the case of an arrangement in accordance with FIG. 3), and FIG. 4B shows the circuit arrangement K1 in accordance with FIG. 2, the circuit arrangement being switched off via its MOSFET M1, with simultaneous illustration of the parasitic capacitances of the junction field effect transistor J1 and of the MOSFET M1.

In FIG. 4A, the junction field effect transistor J1 is switched off on account of the negative bias voltage, for example −20 V, of its gate-source junction, the bias voltage being brought about by the voltage source $U_S$. The reverse flowing phase current flows through the body diode 14 of the junction field effect transistor J1 during the dead time. If it is assumed as a simplification that the voltage drop across the body diode 14 is approximately equal to zero, then the voltage of the voltage source $U_S$ is also present at the drain-gate capacitance $C_{DG}(J1)$ of the junction field effect transistor J1. Since the parasitic semiconductor capacitances decrease as the voltage increases, an expediently low value for the drain-gate capacitance $C_{DG}(J1)$ is already attained.

In order to build up the voltage across the drain-source path of the junction field effect transistor J1, it is then also necessary for the drain-source capacitance $C_{DS}(J1)$ and the already low drain-gate capacitance $C_{DG}(J1)$ of the junction field effect transistor J1 to be subjected to charge reversal. The parallel circuit composed of the two capacitances $C_{DS}(J1)$ and $C_{DG}(J1)$ is referred to as the output capacitance of the junction field effect transistor J1.

In the simplest case, the MOSFET M1 is switched off by a short circuit between its gate terminal 23 and its source terminal 22. If the currentless circuit arrangement K1 is intended to take up voltage, then firstly the MOSFET M1 has to build up voltage between its drain terminal 21 and its source terminal 22 until the voltage has attained the value of the pinch-off voltage (vPI) of the junction field effect transistor J1. For this purpose, it is necessary to charge the output capacitance of the MOSFET M1 consisting of the parallel circuit formed by $C_{DS}(M1)$ and $C_{DG}(M1)$.

Since the junction field effect transistor J1 is in the on state until it reaches its pinch-off voltage vPI, the parasitic capacitances $C_{GS}(J1)$ and $C_{DG}(J1)$ of the junction field effect transistor J1 are in parallel with the output capacitance of the MOSFET M1. In this case, it should be taken into consideration that the individual capacitances involved in the example shown are not biased and therefore have comparatively large values.

The switching-off of the MOSFET M1 of a negative voltage merely reduces the value of the drain-gate capacitance $C_{DG}(M1)$ of the MOSFET, which capacitance is very low anyway in most MOSFET designs and therefore cannot make a relevant contribution to reducing the output capacitance of a circuit arrangement K1.

Until the drain-source voltage vDS(M1) of the MOSFET M1 has attained the value of the pinch-off voltage vPI of the junction field effect transistor J1, the effective output capacitance of the MOSFET M1 consists of the parallel circuit composed of $C_{DS}(M1)$, $C_{DG}(M1)$, $C_{GS}(J1)$ and $C_{DG}(J1)$. If the voltage vPI has been attained, only the junction field effect transistor J1 undertakes the further voltage rise across the load path of the circuit arrangement K1. The drain-source voltage vDS(M1) of the MOSFET M1 remains statically at the value of the pinch-off voltage vPI. Consequently, starting from this point in time, the resulting output capacitance of the circuit arrangement K1 is only composed of the parallel circuit formed by the drain-source capacitance $C_{DS}(J1)$ and the drain-gate capacitance $C_{DG}(J1)$ of the junction field effect transistor J1, that is to say that it thus substantially corresponds to the output capacitance of the junction field effect transistor J1 biased by the separate voltage source $U_S$ in accordance with FIG. 4A.

Exemplary measurements have revealed that the charge which is necessary to raise the voltage across the output capacitance of the circuit arrangement K1 from 0 V to 30 V is six times as high as in the case of a switched-off junction field effect transistor J1 according to FIG. 4A. This makes it clear that there is a considerable charge difference even in the case of small voltage swings in the lower voltage range. The quantity of charge is accompanied by a corresponding charging current that results in increased switching losses of the forward current-carrying semiconductor switch in the half-bridge H. One exemplary measurement revealed that the switch-on energy loss of the circuit arrangement K1 shown in FIG. 3 is approximately 2.75 times the switch-on energy loss that arises if, in the half-bridge H, the field effect transistors M1 and M1' and also the diodes 24 and 24' are dispensed with and, instead, the second load terminal 12 of the junction field effect transistor J1 is connected to the first load terminal 11' of the junction field effect transistor J1' by a low-resistance line, and if, moreover, the second load terminal 12' of the junction field effect transistor J1' is connected to the second load terminal K12' of the circuit arrangement K1' by a low-resistance line. In this case, of course, the driver circuits 3 and 3' would no longer have to drive the control terminals 23 and 23' of the field effect transistors M1 and M1', respectively, but rather the control terminals 13 and 13' of the junction field effect transistors J1 and J1', respectively. For this purpose, the driver circuits 3 and 3' must be suitably adapted, if appropriate. Furthermore, the steep edges of high capacitive charging currents can cause oscillations, which can adversely affect the electromagnetic compatibility (EMC).

It becomes clear from the previous considerations that ideally only the junction field effect transistor J1 should be operated as a switch. In order nevertheless to obtain the functionality of a normally off component for a circuit arrangement comprising a junction field effect transistor J1 and a field effect transistor M1, the field effect transistor M1 used can also be a low-voltage transistor, e.g. a transistor having a permissible reverse voltage of not more than 100 V. In principle, of course, a transistor having a reverse voltage of any desired magnitude can also be used instead of a low-voltage transistor.

Figure 5:
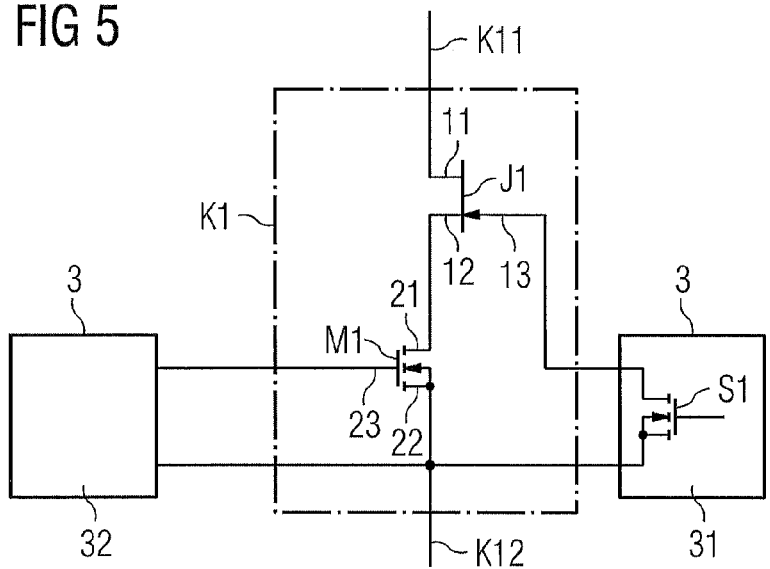
FIG. 5 shows another a circuit arrangement.

One example of such a circuit arrangement K1 is shown in FIG. 5. In the case of this circuit arrangement, in contrast to the circuit arrangement K1 in accordance with FIGS. 2, 3 and 4B, moreover, the control terminal 13 of the junction field effect transistor J1 is not electrically fixedly connected to the second load terminal 22 of the field effect transistor M1, but rather is electrically separated. By way of example, the control terminal 13 of the junction field effect transistor J1 can be led out from a housing in which the circuit arrangement K1 is arranged, without the control terminal 13 being electrically connected to the second load terminal 22 of the field effect transistor M1 within the housing. Instead of the field effect transistor M1, however, in principle a bipolar transistor can also be used.

The driver circuit 3 for driving the circuit arrangement shown in FIG. 5 comprises a first driver unit 31, which, for driving the junction field effect transistor J1, is connected to the control terminal 13 thereof, and also a second driver unit 32, which, for driving the field effect transistor M1, is connected to the control terminal 23 thereof. In this case—unlike in the case of the circuit arrangements K1 and K1' in accordance with FIGS. 2, 3 and 4B—the driving of the junction field effect transistor J1 can be effected independently of the driving of the field effect transistor M1.

The normal switching operation mode of an arrangement in accordance with FIG. 5 can be effected such that the field effect transistor M1 remains permanently switched on by the second driver unit 32. However, if particular situations occur in which the junction field effect transistor J1 cannot be turned off, or cannot be turned off with sufficiently high reliability, by the first driver unit 31, then the field effect transistor 32 is switched off by the second driver unit 32. Such particular situations may be present, for example, when the inverter starts for the first time and the supply voltage for the driver unit 31 is supplied from the intermediate circuit, or when a fault occurs in the voltage supply of the driver unit 31 during the operation of the inverter.

In these cases, the control terminal 13 of the junction field effect transistor J1 has to be switched to the second load terminal 22 of the field effect transistor M1 by the first driver unit 31. For this purpose, it is possible to use a controllable power semiconductor switch S1 integrated into the first driver unit 31, or a diode, the load path of which is connected to the control terminal 13 of the junction field effect transistor J1 at one end of the load path and to the second load terminal 22 of the field effect transistor M1 at the other end of the load path.

Figure 6:
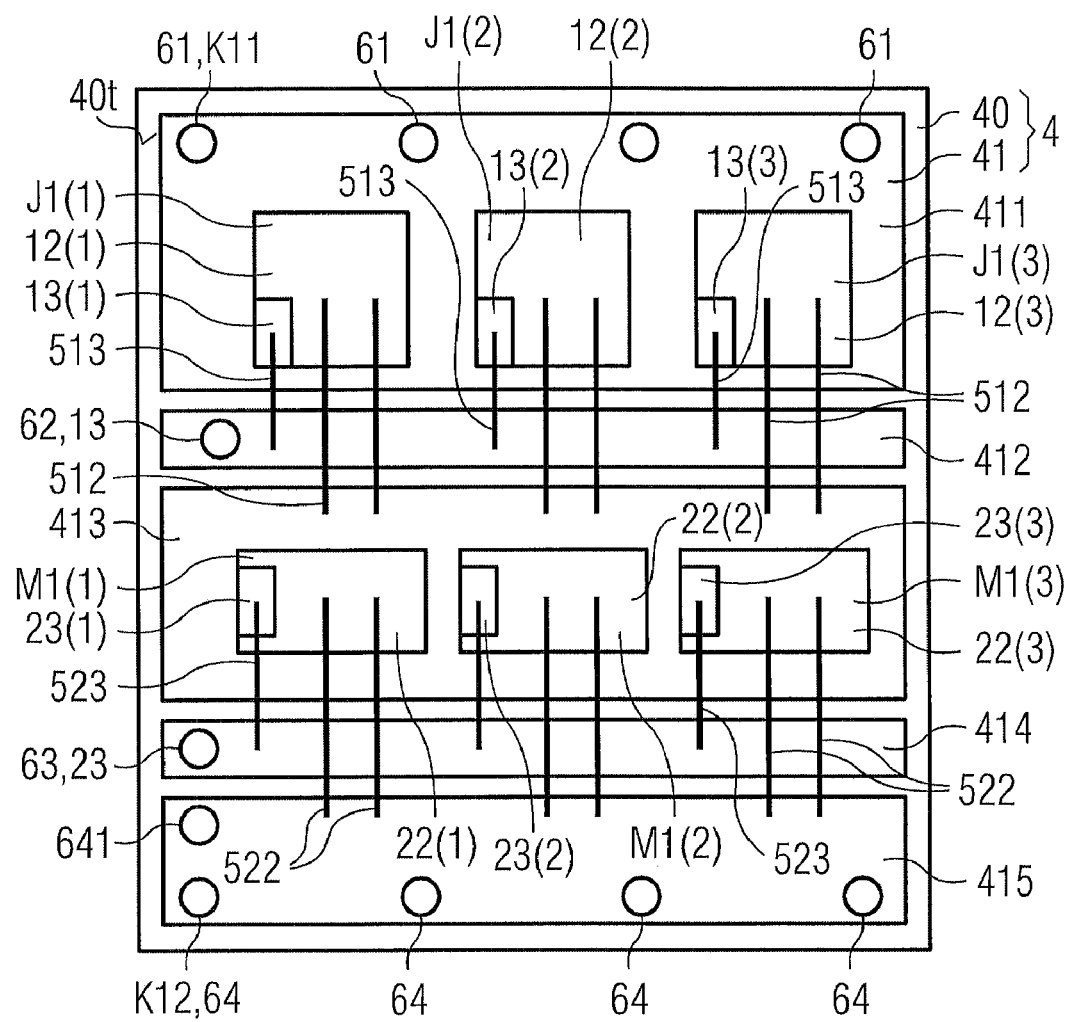
FIG. 6 shows a power semiconductor module.

A circuit arrangement K1 as shown in FIG. 5 can be realized in a power semiconductor module, for example. For this purpose, the power semiconductor module can have a circuit carrier 4, on which—as is shown in FIG. 6—the junction field effect transistor J1 and the field effect transistor M1 are arranged.

The circuit carrier 4 can have a dielectric insulation carrier 40, for example, which is embodied as a flat lamina. On its top side 40*t*, one of the two main areas of the flat lamina, the insulation carrier 40 is provided with an upper metallization layer 41, which is areally and fixedly connected to the top side 40*t* in the entire layer region of the metallization layer, that is to say that the upper metallization layer 41 makes contact with the top side 40*t* at every point on its lateral region of extent. Furthermore, the upper metallization layer 41 is structured to form conductor tracks 411, 412, 413, 414, 415. Conductor tracks are understood in this sense to mean a section of the metallization layer which is shaped as desired and which is spaced apart from all other sections of the metallization layer 41. A conductor track can be embodied for example in elongate fashion, or in areal fashion e.g. for the mounting of a power semiconductor chip. Moreover, a conductor track can also have both one or a plurality of elongate sections and one or a plurality of areal sections.

On its underside remote from the top side 40*t*, the insulation carrier 40 can likewise be provided with a metallization layer. This metallization layer is unstructured, but can if necessary likewise be structured to form conductor tracks.

The circuit carrier 4 can be embodied for example as a DCB substrate (DCB=direct copper bonding), as a DAB substrate (DAB=direct aluminum bonding) or as an AMB substrate (AMB=active metal brazing). The upper metallization layer 41 can e.g. wholly or at least predominantly consist of copper or of aluminum. The insulation carrier 40 can be formed from a ceramic, for example. Examples of suitable ceramic materials for this purpose include aluminum nitride (AlN), aluminum oxide ($Al_2O_3$), silicon nitride ($Si_3N_4$), silicon carbide (SiC), or beryllium oxide (BeO). Optionally, the upper metallization layer 41 and/or the lower metallization layer can superficially be coated with at least one thin layer composed of one of the following materials in order to improve the solderability: silver, NiAu, NiPd, NiPdAu.

Each of the controllable power semiconductor switches J1 and M1 shown in FIG. 5 can comprise just exactly one power semiconductor chip or else a plurality of power semiconductor chips electrically connected in parallel. In this sense "connected in parallel" means that mutually corresponding terminals of the power semiconductor chips connected in parallel are connected to one another, that is to say e.g. all drain terminals are connected to one another, all source terminals are connected to one another, and all gate terminals are connected to one another.

In FIG. 6 this is shown by way of example on the basis of three power semiconductor chips J1(1), J1(2) and J1(3), each of which contains a junction field effect transistor and which are electrically connected in parallel and thereby form the junction field effect transistor J1. In this case, each of the power semiconductor chips J1(1), J1(2) and J1(3) has a load path, which are likewise connected in parallel on account of the parallel connection of the power semiconductor chips J1(1), J1(2) and J1(3) and thus form the load path of the controllable power semiconductor switch J1.

The power semiconductor chips J1(1), J1(2) and J1(3) are embodied as vertical power semiconductor chips and, on their undersides facing the circuit carrier 4, each have a first load terminal, in this example this is in each case the drain terminal, by which they are electrically conductively connected to the conductor track 411. Suitable connection techniques for this purpose include soldering, diffusion soldering, electrically conductive adhesive bonding, or low-temperature pressure sintering (low-temperature connection), wherein a paste comprising silver powder and a solvent is introduced between the relevant power semiconductor chip J1(1), J1(2) and J1(3) and the conductor track 411 and then the power semiconductor chip J1(1), J1(2) and J1(3) and the circuit carrier 4 are pressed onto one another with high pressure.

The power semiconductor chips J1(1), J1(2) and J1(3) are electrically connected to the conductor track 413 by means of bonding wires 512 at their second load terminals 12(1), 12(2) and 12(3)—in this example this is in each case the source terminal—which are situated on that side of the relevant power semiconductor chip J1(1), J1(2) and J1(3) which is remote from the insulation carrier 40. Likewise on their sides remote from the insulation carrier 40, the power semiconductor chips J1(1), J1(2) and J1(3) in each case have a control terminal 13(1), 13(2) and 13(3), respectively, which is permanently electrically conductively concomitantly connected to the separate conductor track 412 by means of a bonding wire 513.

Furthermore, by way of example, three power semiconductor chips M1(1), M1(2) and M1(3) are provided, each of which contains a field effect transistor, which are electrically connected in parallel and thereby form the field effect transistor M1. In this case, each of the power semiconductor chips M1(1), M1(2) and M1(3) has a load path, which are likewise connected in parallel on account of the parallel connection of the power semiconductor chips M1(1), M1(2) and M1(3) and thus form the load path of the controllable power semiconductor switch M1.

The power semiconductor chips M1(1), M1(2) and M1(3) are embodied as vertical power semiconductor chips and, on their undersides facing the circuit carrier 4, each have a first load terminal, in this example this is in each case the drain terminal, by which they are electrically conductively connected to the conductor track 413. Suitable connection techniques for this purpose include, in this case as well, soldering, diffusion soldering, electrically conductive adhesive bonding, or low-temperature pressure sintering (low-temperature connection) already explained in greater detail above.

The power semiconductor chips M1(1), M1(2) and M1(3) are electrically connected to the conductor track 415 by means of bonding wires 522 at their second load terminals 22(1), 22(2) and 22(3)—in this example this is in each case the source terminal—which are situated on that side of the relevant power semiconductor chip M1(1), M1(2) and M1(3) which is remote from the insulation carrier 40. Likewise on their sides remote from the insulation carrier 40, the power semiconductor chips M1(1), M1(2) and M1(3) in each case have a control terminal 23(1), 23(2) and 23(3), respectively, which is electrically connected to the conductor track 414 by means of a bonding wire 523. For the sake of completeness, it is pointed out that the bonding Only the control terminals 13(1), 13(2) and 13(3) of the power semiconductor chips J1(1), J1(2) and J1(3), respectively, are permanently electrically conductively connected to the separate conductor track 412 by means of the bonding wires 513. However, there is no permanent electrically conductive connection either between the conductor track 412 and any of the first and second load terminals of the power semiconductor chips J1(1), J1(2), J1(3), M1(1), M1(2) and M1(3), or between the conductor track 412 and any of the control terminals 23(1), 23(2) and 23(3) of the power semiconductor chips M1(1), M1(2) and M1(3), respectively. This gives rise to the possibility of separately driving the junction field effect transistor J1 and the field effect transistor M1. The conductor track 412 can be arranged, as shown, between the conductor track 411 and the conductor track 413.

In order that the circuit carriers 4 equipped with the power semiconductor chips J1(1), J1(2), J1(3), M1(1), M1(2) and M1(3) and the bonding wires 512, 513, 522, 523 are contact-connected toward the outside, terminal elements 61, 62, 63, 641 are provided, which extend away from the circuit carrier 4 from the plane of the metallization layer 41. At their sides facing the circuit carrier 4, the terminal elements 61, 62, 63, 64 and 641 in each case have a base point at which they are electrically conductively connected to the conductor tracks 411, 412, 414 and 415, respectively. The terminal elements 61, 62, 63, 64 and 641 serve for making electrical contact with the circuit arrangement K1 realized on the circuit carrier 4. The terminal elements 61, 62, 63, 64 and 641 can be embodied for example as metallic terminal lugs, e.g. as stepped and then bent metal sheets, or as metallic rods. The terminal elements 61 and 64 serve for feeding in and carrying away a load current through the circuit arrangement K1. They can therefore have a higher current-carrying capacity than the other terminal elements 62, 63 and 641. In order to increase the current-carrying capacity and/or in order to make it possible to use a flat, low-inductance terminal conductor connected to terminal elements 61, 62, 63 or 64, a conductor track 411, 412, 414 or 415 to be contact-connected, instead of being provided with only one terminal element 61, 62, 63 or 64, can be provided with a plurality of terminal elements spaced apart from one another, as is shown in FIG. 6 by way of example for the terminal elements 61 and 64 of the conductor tracks 411 and 415, respectively.

The terminal element 641, which, in the same way as the terminal element 64, at its side facing the circuit carrier 4, is electrically conductively connected to the conductor track 415, serves as an auxiliary terminal that can be used e.g.—in the same way as the terminal elements 62 and 63—for connecting a driver unit 31, 32. In principle, even further terminal elements can be provided. Moreover, as an alternative, at least individual terminal elements from among the terminal elements 61, 62, 63, 64, 641 can be placed by their side facing the circuit carrier 4 onto the top side—remote from the circuit carrier 4—of one of the power semiconductor chips J1(1), J1(2), J1(3), M1(1), M1(2) or M1(3) and can be electrically connected there to a terminal area of the relevant power semiconductor chip J1(1), J1(2), J1(3), M1(1), M1(2) or M1(3).

In arrangements in which the power semiconductor chips J1(1), J1(2), J1(3), M1(1), M1(2) and M1(3) are arranged in a housing, depending on further interconnection, those sides of all or some of the terminal elements 61, 62, 63, 64 and 641 which are remote from the circuit carrier 4 can project from the housing and be contact-connected there as required. Moreover, at least a portion of the terminal elements 61, 62, 63, 64 and 641 can be e.g. electrically connected to a driver unit 31 or 32 in the interior of the housing.

The metallization layer 41 has no section to which both the second load terminal 22 of the field effect transistor M1 and the control terminal 13 of the junction field effect transistor J1 are electrically connected. The control terminal 13 of the junction field effect transistor J1 is therefore led out from the plane of the metallization layer 41 separately by means of the terminal element 62.

Figure 7:
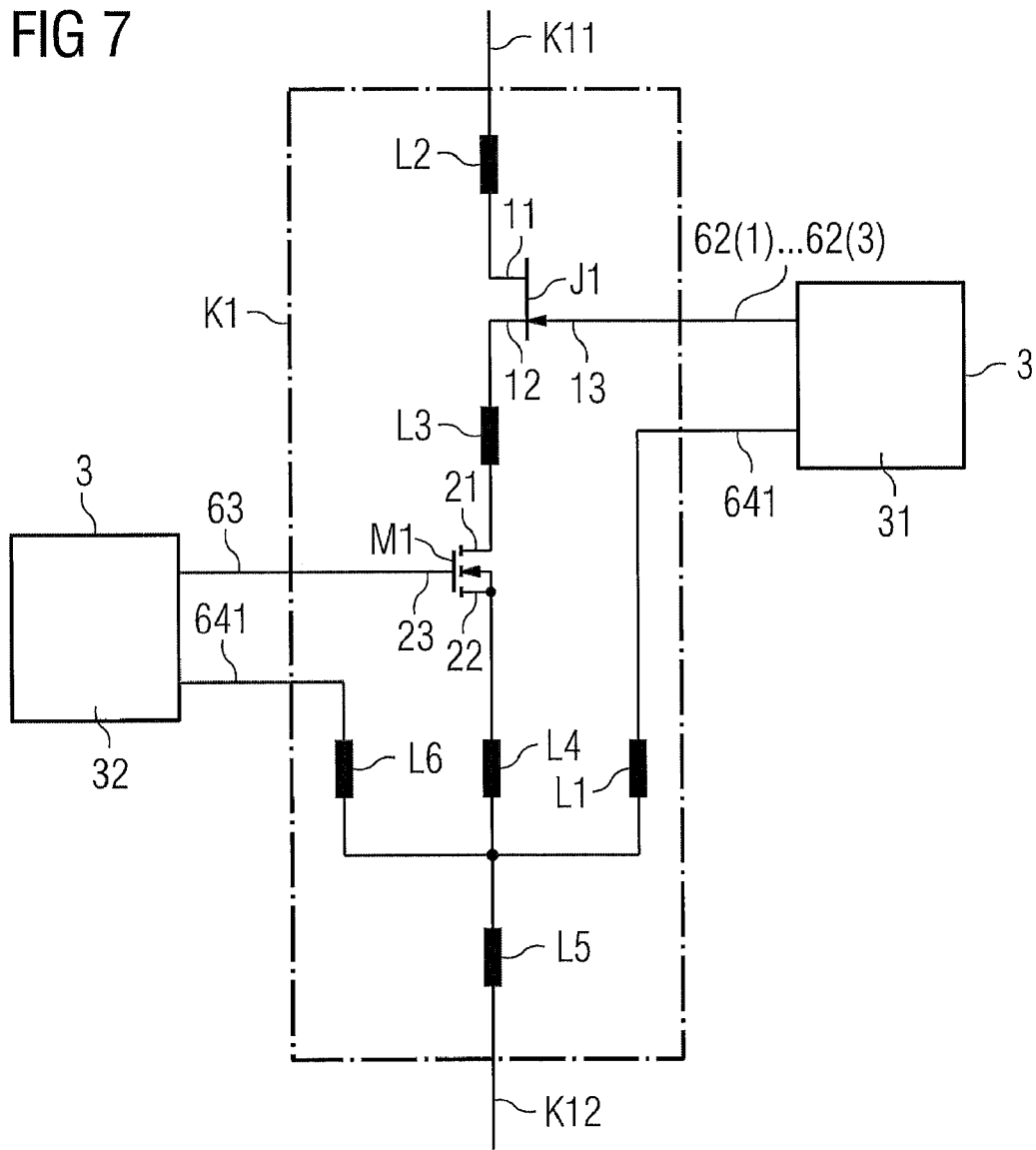
FIG. 7 shows an equivalent circuit diagram of power semiconductor chips arranged in the power semiconductor module of FIG. 6.

The equivalent circuit diagram with respect to this arrangement is shown in FIG. 7. Since the field effect transistor M1 is permanently switched on in the normal operation mode of the circuit arrangement K1, the junction field effect transistor J1 alone performs the dynamic switching processes. Since the semiconductor bodies of the power semiconductor chips J1(1), J1(2) and J1(3) forming the junction field effect transistor J1 comprise silicon carbide as basic material, the junction field effect transistor J1 switches very rapidly, in principle, for which reason a drive circuit of low-inductance design is of considerable importance.

The total inductance LG that is effective in the drive circuit of the junction field effect transistor J1 is the sum of all the individual inductances situated therein. For the exemplary realization in accordance with FIG. 6 and its equivalent circuit diagram in accordance with FIG. 7, that is the sum of the leakage inductances L1 of the outer gate circuit, of the junction field effect transistor J1, of the source-side inductance L4 of the power semiconductor chips M1(1), M1(2) and M1(3) forming the field effect transistor M1, and also of the source-side inductance L3 of the power semiconductor chips J1(1), J1(2) and J1(3) forming the junction field effect transistor J1. The following holds true:

$$LG = L1 + L3 + L4 \tag{1}$$

Alongside the value of the sum of the individual inductances L1, L3, L4, this sum impeding charge-reversal processes of the parasitic capacitances and hence rapidly proceeding switching processes, transient processes during switching result in voltages being induced at the inductances L2, L3, L4 and L5. The voltages induced at the inductances L3 and L4 in this case have an effect such that a negative feedback arises in the gate circuit of the junction field effect transistor J1, which slows down the switching process further.

Therefore, provision is made, alongside a lowest possible cumulative inductance in the gate circuit of the junction field effect transistor J1, for keeping the inductances L3 and L4 small or, if possible, not including them in the gate circuit at all.

Figure 8:
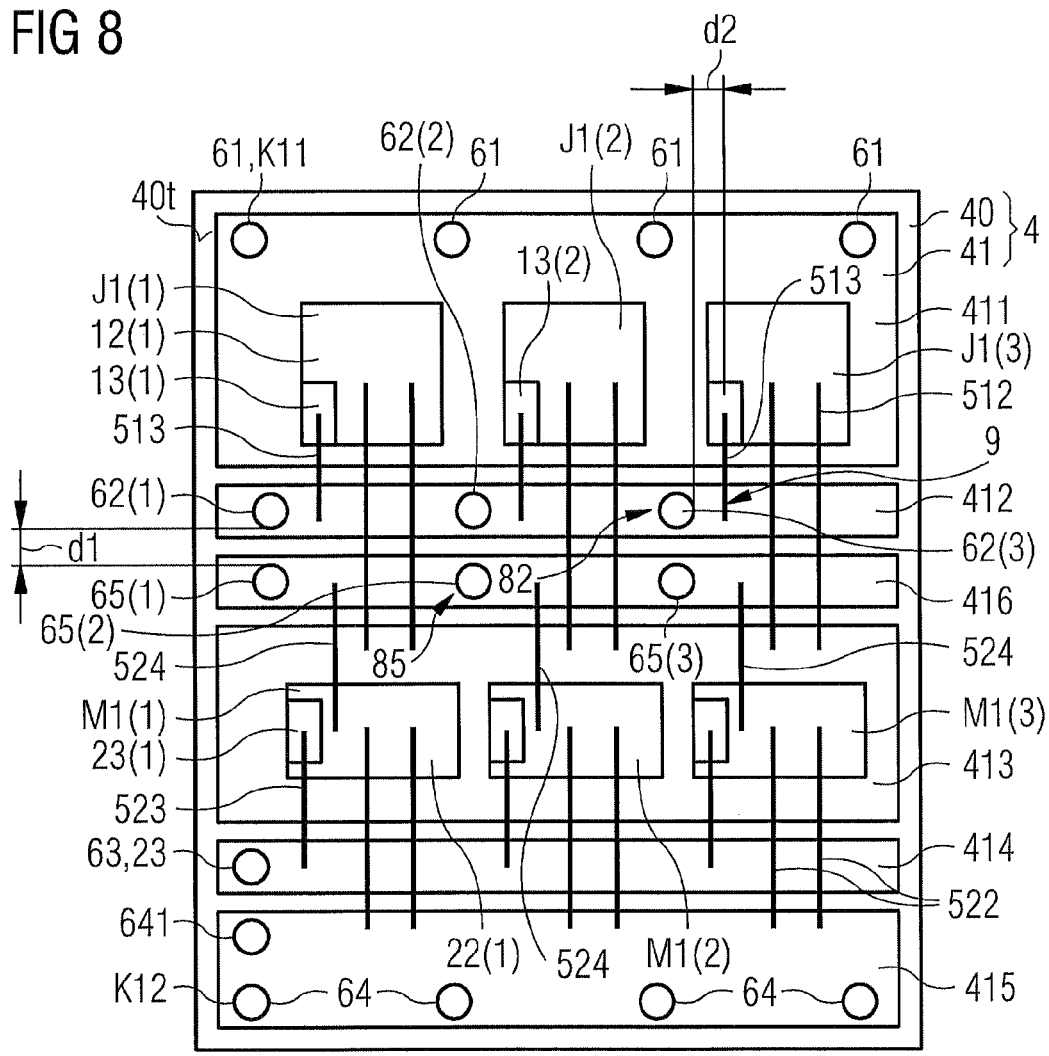
FIG. 8 shows another power semiconductor module.
Figure 9:
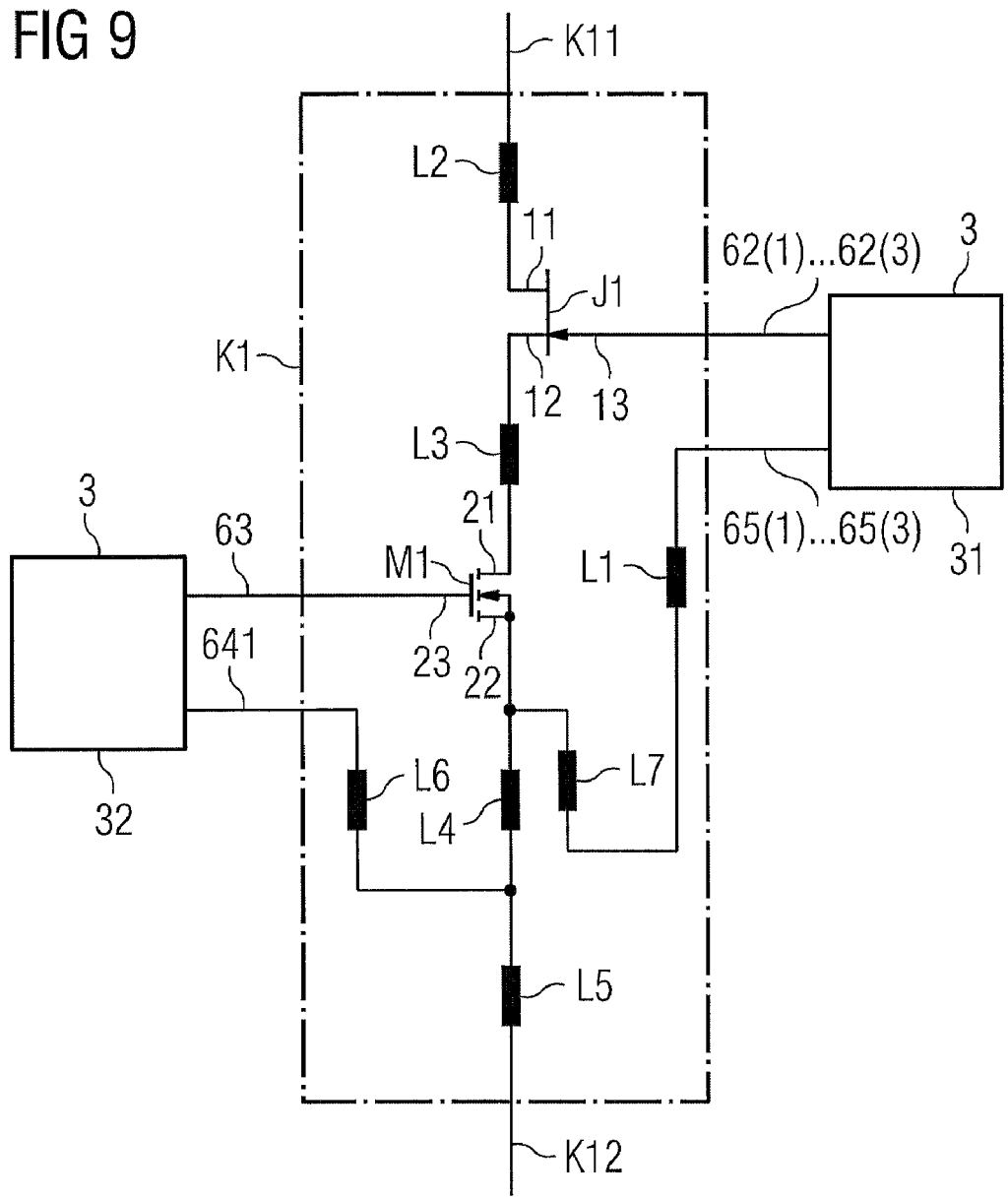
FIG. 9 shows an equivalent circuit diagram of power semiconductor chips arranged in the power semiconductor module of FIG. 8.

The way in which such an arrangement can be realized is shown in FIG. 8 in conjunction with its equivalent circuit diagram in accordance with FIG. 9. Unlike in the arrangement in accordance with FIGS. 6 and 7, the second load terminals 22(1), 22(2), 22(3) of the power semiconductor chips M1(1), M1(2) and M1(3), respectively, forming the field effect transistor M1 are electrically connected jointly to a further conductor track 416, which is embodied in the metallization layer 41, in each case by means of at least one additional connection line 524. In this case, such an additional connection line 524 can be formed integrally or—as shown—non-integrally with one of the connection lines 522. The connection lines 524 can be embodied as bonding wires, for example. The conductor track 416 can be arranged e.g. completely or at least in sections directly adjacent to the conductor track 412, to which the control terminals 13(1), 13(2) and 13(3) of the power semiconductor chips J1(1), J1(2) and J1(3) forming the junction field effect transistor J1 are connected.

In this sense "directly" means that over the relevant section of the conductor track 416 or over the entire extent thereof no other conductor track formed in the metallization layer 41 is situated between the conductor tracks 412 and 416. The conductor track 413, on which the power semiconductor chips M1(1), M1(2) and M1(3) are mounted, can optionally be arranged between the conductor track 416 and the conductor track 415, to which the second load terminals 22(1), 22(2) and 22(3) of the power semiconductor chips M1(1), M1(2) and M1(3), respectively, are in each case connected. The conductor track 416 can likewise optionally be arranged between the conductor tracks 412 and 413.

The connection of the second load terminals 22(1), 22(2) and 22(3) of the power semiconductor chips M1(1), M1(2) and M1(3), respectively, to such a separate conductor track 416 prevents the gate circuit of the junction field effect transistor J1, as in the arrangement in accordance with FIGS. 6 and 7, from being routed via the inductance L4 carrying the load current of the circuit arrangement K1, the inductance comprising the bonding wires 522, inter alia, and also that section of the conductor track 415 which connects the bonding wires 522. That proportion of the leakage inductance L4 which is still effective in the gate circuit of the junction field effect transistor J1 in the arrangement in accordance with FIGS. 6 and 7 is replaced by the significantly lower leakage inductance L7 comprising, inter alia, the additional connection lines 524 and that section of the conductor track 416 which electrically connects the lines.

This measure reduces both the cumulative inductance LG and the negative feedback. Very fast switch-on and switch-off processes of the JFETs are the consequence. The following then holds true for the total inductance LG which is effective in the drive circuit of the junction field effect transistor J1:

$$LG = L1 + L3 + L7 \qquad (2)$$

Furthermore, the arrangement in accordance with FIG. 8 is suitable, on account of the possibility of routing the conductor tracks 412 and 416 at a small distance from one another and/or in parallel fashion, for optionally using in each case a plurality of terminal elements 62(1), 62(2), 62(3) and 65(1), 65(2), 65(3) for making contact with the conductor tracks 412 and 416, respectively. In this case, the terminal elements 62(1), 62(2), 62(3) are each electrically conductively connected to the conductor track 412 at a first connection location 82 and the terminal elements 65(1), 65(2), 65(3) are each electrically conductively connected to the conductor track 416 at a second connection location 85.

In this case, the terminal elements 62(1), 62(2), 62(3) and 65(1), 65(2), 65(3) can optionally be arranged such that each of the terminal elements 62(1), 62(2), 62(3) together with another of the terminal elements 65(1), 65(2), 65(3) forms a pair (62(1); 65(1)), (62(2); 65(2)), (62(3); 65(3)). In this case, for each of the terminal elements 62(1), 62(2), 62(3), the terminal element 65(1), 65(2), 65(3) which forms a pair with the relevant one of the terminal elements 62(1), 62(2), 62(3) can be that one of the terminal elements 65(1), 65(2), 65(3) which is situated closest to the relevant one of the terminal elements 62(1), 62(2), 62(3). In this case, for exactly one, a plurality or each of the pairs (62(1); 65(1)), (62(2); 65(2)), (62(3); 65(3)), the distance d1 between the terminal elements 62(1), 62(2), 62(3), 65(1), 65(2), 65(3) of the pair (62(1); 65(1)), (62(2); 65(2)), (62(3); 65(3)) can be chosen to be less than or equal to 5 mm.

By virtue of the terminal elements 62(1), 62(2), 62(3) and 65(1), 65(2), 65(3) being arranged in pairs, it is possible to realize a low-inductance connection between the circuit carrier 4 equipped with the power semiconductor chips J1(1), J1(2), J1(3), M1(1), M1(2), M1(3) and the first driver unit 31. The first driver unit 31 can be positioned for example in or outside a module housing, in which, inter alia, the power semiconductor chips J1(1), J1(2), J1(3), M1(1), M1(2), M1(3) are arranged, on that side of the power semiconductor chips J1(1), J1(2), J1(3), M1(1), M1(2), M1(3) which is remote from the circuit carrier 4. The first driver unit 31 can be realized for example by means of a conventional, non-ceramic-based printed circuit board (PCB), on which the electrical components of the first driver unit 31 and optionally also of the second driver unit 32 are mounted. Such a printed circuit board can run e.g. parallel to the circuit carrier 4.

Furthermore, and independently of the other configurations explained, each of the terminal elements 62(1), 62(2), 62(3) can be arranged on the circuit carrier 4 such that it is at a distance d2 of less than or equal to 10 mm from that one of the connection locations 9 between the conductor track 412 and the bonding wires 513 which is situated closest to the terminal element.

Independently of whether only one or a plurality of terminal elements 62(1), 62(2), 62(3) and 65(1), 65(2), 65(3) are provided per conductor track 412 and 416, respectively, and whether or not a paired arrangement of terminal elements 62(1), 62(2), 62(3) and 65(1), 65(2), 65(3) of different conductor tracks 412 and 416, respectively, is present, the first driver unit 31 can be connected to at least one of the terminal elements 62(1), 62(2), 62(3) and to at least one of the terminal elements 65(1), 65(2), 65(3). By way of example, in one power semiconductor module, a single first driver unit 31 can be provided, to which all pairs (62(1); 65(1)), (62(2); 65(2)), (62(3); 65(3)), of terminal elements are connected. It is likewise possible, however, to provide a dedicated first driver unit for each of these pairs (62(1); 65(1)), (62(2); 65(2)), (62(3); 65(3)) of the power semiconductor module, to which unit the relevant pair (62(1); 65(1)), (62(2); 65(2)), (62(3); 65(3)), is connected.

By virtue of a configuration in accordance with FIGS. 8 and 9, the first driver unit(s) 31 for driving all power semiconductor chips J1(1), J1(2) and J1(3) forming the junction field effect transistor J1 and also the associated peripheral circuitry elements (e.g. backup capacitors, resistors, etc.) can be arranged in direct proximity to the power semiconductor chips J1(1), J1(2) and J1(3). The strip-conductor-type character of the conductor tracks 412 and 416 also allows a strip-conductor-type connection of the conductor tracks 412 and 416 to one or a plurality of first driver unit(s) 31. This permits, as a result, extremely fast switching processes with a minimum of leakage inductance and thus also a minimum negative feedback caused by transient processes in the power circuit.

In the circuit arrangements explained with reference to FIGS. 6 and 8, the electrically conductive connections are realized with the aid of conductor tracks 411, 412, 413, 414, 415 and 416 embodied as sections of the upper metallization layer 41, and also with the aid of bonding wires 512, 513, 522, 523 and 524. In a departure from this, instead of the bonding wires 512, 513, 522, 523 and 524, a flexible printed circuit board can also be provided, which has a conductor structure having a plurality of flexible conductor tracks which are spaced apart from one another and which perform the function of the bonding wires 512, 513, 522, 523 and 524. In order that specific conductor tracks from among the flexible conductor tracks are electrically insulated from one another, a flexible dielectric film can be arranged between them. The totality of the flexible conductor tracks and of the flexible dielectric films constitutes an assemblage that can be produced by lamination. The finished assemblage can be produced in an accurately fitting manner with respect to the circuit carrier 4 equipped with the power semiconductor chips J1(1), J1(2), J1(3), M1(1), M1(2) and M1(3) and can then be connected to the circuit carrier 4, thus giving rise to the circuit arrangement K1 explained.

Instead of applying a prefabricated film assemblage to the circuit carrier 4 equipped with the power semiconductor chips J1(1), J1(2), J1(3), M1(1), M1(2) and M1(3), the individual flexible dielectric layers and the individual flexible conductor tracks can also be applied to the equipped circuit carrier 4 successively.

Figure 10:
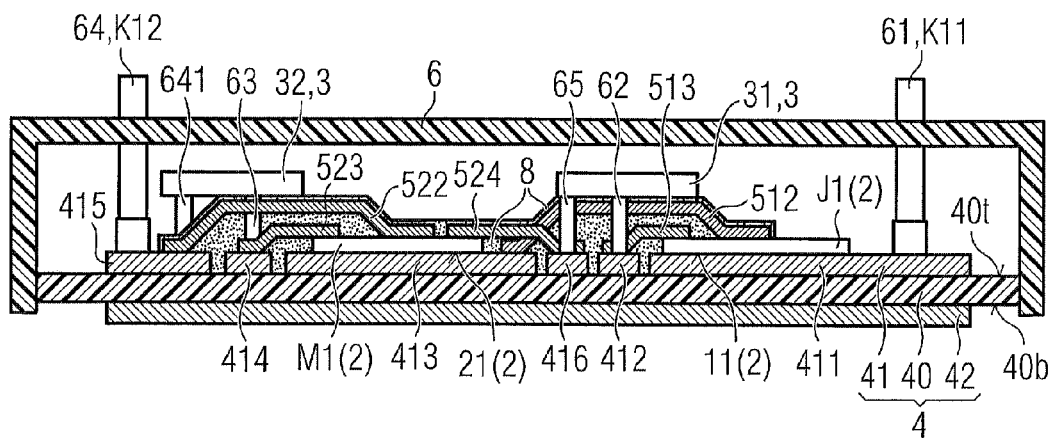
FIG. 10 shows a vertical section through a power semiconductor module.

FIG. 10 shows a vertical section through such an arrangement, which—apart from the fact that the top-side interconnection of the power semiconductor chips J1(1), J1(2), J1(3), M1(1), M1(2) and M1(3) and of the conductor tracks 411, 412, 413, 414, 415 and 416 is not realized by means of bonding wires but rather by means of a flexible printed circuit board—corresponds to the arrangement in accordance with FIG. 8. The flexible conductor tracks of the flexible printed circuit board are respectively provided with the same reference symbol as the circuit-technologically identical bonding wire in accordance with FIG. 8. The flexible dielectric films of the flexible printed circuit board are designated by the reference symbol 8.

The power semiconductor chips J1(1), J1(2), J1(3), M1(1), M1(2) and M1(3) mounted on the circuit carrier 4 are arranged in a housing 6, from which the terminal elements 61 and 64 project in order to enable electrical contact to be made with the power semiconductor module externally. Moreover, the first driver unit 31 and the second driver unit 32 are situated in the interior of the housing 6, the driver units being electrically connected to the circuit arrangement K1 by means of the terminal elements 62 and 65 and, respectively, 63 and 641.

As can likewise be discerned with reference to FIG. 10, a metallization layer 42 can likewise be applied to the underside 40b remote from the top side 40t of the insulation carrier 40.

Figure 11:
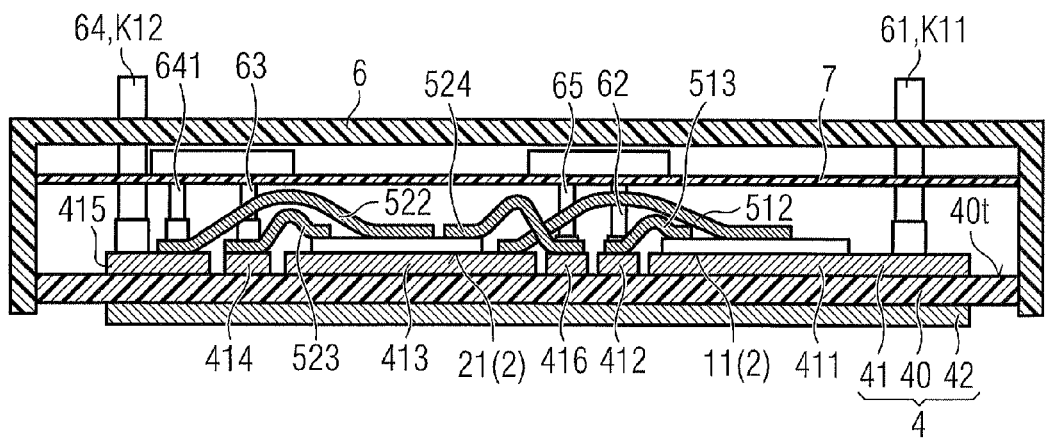
FIG. 11 shows a vertical section through another power semiconductor module.

FIG. 11 shows a vertical section through a power semiconductor module that is used to realize the same circuit arrangement K1 as in the case of the power semiconductor module in accordance with FIG. 10. Unlike in the latter, however, the interconnection of the power semiconductor chips J1(1), J1(2), J1(3), M1(1), M1(2) and M1(3) mounted on the circuit carrier 4 is not effected with the aid of a flexible printed circuit board, but rather with the aid of bonding wires.

Moreover, the first driver unit 31 and the second driver unit 32 are mounted on a printed circuit board 7 arranged in the housing 6 on that side of the power semiconductor chips J1(1), J1(2), J1(3), M1(1), M1(2) and M1(3) which is remote from the circuit carrier 4.

In the examples above, the power semiconductor switches J1 and M1 in each case comprise three power semiconductor chips connected in parallel. In a departure from this, each of the power semiconductor switches J1 and M1 can also have exactly one, two or more than three power semiconductor chips, connected in parallel. Moreover, the number of power semiconductor chips J1(1), J1(2), J1(3) forming the power semiconductor chip J1 can be chosen, in principle, independently of the number of power semiconductor chips M1(1), M1(2), M1(3) forming the power semiconductor chip M1.

A power semiconductor module explained above can be operated such that at least one first driver unit 31 provides a first drive signal, with which the control terminals 13(1), 13(2), 13(3) of the first power semiconductor chips J1(1), J1(2), J1(3) can be driven in such a way that, during a switch-on process, the load path of each of the first power semiconductor chips J1(1), J1(2), J1(3) can be switched from an off state to an on state, or that, during a switch-off process, the load path of each of the second power semiconductor chips J1(1), J1(2), J1(3) can be switched from an on state to an off state.

It is correspondingly possible to provide at least one second driver unit 32 for providing a second drive signal, with which the control terminals 23(1), 23(2), 23(3) of the second power semiconductor chips M1(1), M1(2), M1(3) can be driven such that, during a switch-on process, the load path of each of the second power semiconductor chips M1(1), M1(2), M1(3) can be switched from an off state to an on state, or that, during a switch-off process, the load path of each of the second power semiconductor chips M1(1), M1(2), M1(3) can be switched from an on state to an off state.

The first and/or the second drive signal can be a rectangular voltage, for example.

In this case, the second driver unit 32 can optionally put the load path of each of the second power semiconductor chips M1(1), M1(2), M1(3) permanently in an on state during a changeover switching operation mode of all the first power semiconductor chips J1(1), J1(2), J1(3), which comprises at least one switch-on process and at least one switch-off process.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module comprising:
   a normally on, controllable first power semiconductor switch, which comprises one or a plurality of first power semiconductor chips electrically connected in parallel, each of which has a first load terminal, a second load terminal, and a control terminal and also a load path formed between the first load terminal and the second load terminal of the relevant first power semiconductor chip, wherein the first power semiconductor switch has a load path formed by the parallel circuit composed of the load paths of the first power semiconductor chips;
   a normally off, controllable second power semiconductor switch, which comprises one or a plurality of second power semiconductor chips electrically connected in parallel, each of which has a first load terminal, a second load terminal, and also a control terminal, and also a load path formed between the first load terminal and the second load terminal of the relevant second power semiconductor chip, wherein the second power semiconductor switch has a load path formed by the parallel circuit composed of the load paths of the second power semiconductor chips;

a circuit carrier, which comprises an insulation carrier having a top side and an upper metallization layer applied to the top side, said metallization layer being structured to form conductor tracks;

wherein:

all first power semiconductor chips are arranged on a first one of the conductor tracks;

all second power semiconductor chips are arranged on a second one of the conductor tracks;

the load paths of the first power semiconductor switch and of the second power semiconductor switch are electrically connected in series;

the control terminals of all first power semiconductor chips are permanently electrically conductively connected to a third one of the conductor tracks;

none of the first load terminals and none of the second load terminals of the first power semiconductor chips are permanently electrically conductively connected to the third conductor track;

none of the first load terminals, none of the second load terminals and none of the control terminals of the second power semiconductor chips are permanently electrically conductively connected to the third conductor track; and the second load terminals of the second power semiconductor chips are permanently electrically conductively connected to a fourth one of the conductor tracks.

2. The power semiconductor module as claimed in claim 1, wherein the second load terminals of the second power semiconductor chips are permanently electrically conductively connected to a fifth one of the conductor tracks, wherein the fifth conductor track is spaced apart from the fourth conductor track.

3. The power semiconductor module as claimed in claim 2, wherein the second conductor track is arranged between the fourth conductor track and the fifth conductor track and/or the fifth conductor track is arranged between the second conductor track and the third conductor track.

4. The power semiconductor module as claimed in claim 2, further comprising one or a plurality of pairs of terminal elements, wherein each of the pairs of terminal elements comprises a first terminal element having a side facing the circuit carrier at which it is permanently electrically conductively connected to the third conductor track, and a second terminal element having a side facing the circuit carrier at which it is permanently electrically conductively connected to the fifth conductor track.

5. The power semiconductor module as claimed in claim 4, wherein, in exactly one, at least one or all pairs of terminal elements, the first terminal element is at a distance of less than or equal to 5 mm from the second terminal element.

6. The power semiconductor module as claimed in claim 2, further comprising a plurality of pairs of terminal elements, wherein in each of the pairs of terminal elements a first terminal element is permanently electrically conductively connected to the third conductor track at a first connection location; an electrical connection line is provided to the control terminal of each of the first power semiconductor chips, said electrical connection line being permanently electrically conductively connected to the third one of the conductor tracks at a second connection location; in exactly one, a plurality or each of the pairs, the first connection location is at a distance of less than or equal to 10 mm from one of the second connection locations.

7. The power semiconductor module as claimed in claim 1, wherein the third conductor track is arranged between the first conductor track and the second conductor track.

8. The power semiconductor module as claimed in claim 1, wherein the insulation carrier is embodied as a ceramic lamina and/or wherein the upper metallization layer is areally and fixedly connected to the top side of the insulation carrier over an entire layer region of said metallization layer.

9. The power semiconductor module as claimed in claim 1, wherein exactly one, a plurality or each of the first power semiconductor chips has a semiconductor body comprising the basic material silicon carbide.

10. The power semiconductor module as claimed in claim 1, wherein the first power semiconductor chips and the second power semiconductor chips have, on their sides remote from the circuit carrier, terminal contacts which are electrically conductively connected among one another and also to the upper metallization layer by means of a flexible printed circuit board formed by an assemblage of flexible conductor tracks and one or a plurality of flexible dielectric films.

11. The power semiconductor module as claimed in claim 1, further comprising:

at least one first driver unit operable to provide a first drive signal for driving the control terminals of the first power semiconductor chips such that:

(a) during a switch-on process, the load path of each of the first power semiconductor chips can be switched from an off state to an on state; and (b) during a switch-off process, the load path of each of the first power semiconductor chips can be switched from an on state to an off state;

at least one second driver unit for providing a second drive signal for driving the control terminals of the second power semiconductor chips driven such that the load path of each of the second power semiconductor chips is permanently in an on state during a changeover switching operation mode of all first power semiconductor chips, which comprises at least one switch-on process and at least one switch-off process.

12. A power semiconductor module, comprising:

a normally on, controllable first power semiconductor switch including a plurality of first power semiconductor chips;

a normally off, controllable second power semiconductor switch including a plurality of second power semiconductor chips;

wherein load paths of the first power semiconductor switch and of the second power semiconductor switch are connected in series; and wherein control terminals of the first power semiconductor chips are permanently electrically conductively connected to a conductor track to which no load terminal of any of the first power semiconductor chips is permanently electrically conductively connected and to which no load terminal and no control terminal of any of the second power semiconductor chips are permanently electrically conductively connected.

13. A method for operating a power semiconductor module comprising:

providing a power semiconductor module including a normally on, controllable first power semiconductor switch, which comprises one or a plurality of first power semiconductor chips electrically connected in parallel, each of which has a first load terminal, a second load terminal, and a control terminal and also a load path formed between the first load terminal and the second load terminal of the relevant first power semiconductor chip, wherein the first power semiconductor switch has a load path formed by the parallel circuit composed of the load paths of the first power semiconductor chips; a normally off, controllable second power semiconductor switch, which comprises one or a plurality of second power semiconductor chips electrically connected in parallel, each of which has a first load terminal, a second load terminal, and also a control terminal, and also a load path formed between the first load terminal and the second load terminal of the relevant second power semiconductor chip, wherein the second power semiconductor switch has a load path formed by the parallel circuit composed of the load paths of the second power semiconductor chips; a circuit carrier, which comprises an insulation carrier having a top side and an upper metallization layer applied to the top side, said metallization layer being structured to form conductor tracks; wherein all first power semiconductor chips are arranged on a first one of the conductor tracks, all second power semiconductor chips are arranged on a second one of the conductor tracks, the load paths of the first power semiconductor switch and of the second power semiconductor switch are electrically connected in series, the control terminals of all first power semiconductor chips are permanently electrically conductively connected to a third one of the conductor tracks, none of the first load terminals and none of the second load terminals of the first power semiconductor chips are permanently electrically conductively connected to the third conductor track, none of the first load terminals, none of the second load terminals and none of the control terminals of the second power semiconductor chips are permanently electrically conductively connected to the third conductor track, and the second load terminals of the second power semiconductor chips are permanently electrically conductively connected to a fourth one of the conductor tracks;

driving the control terminals of the second power semiconductor chips such that the load path of each of the second power semiconductor chips is permanently in an on state during a time interval in which a changeover switching operation mode of all first power semiconductor chips is carried out, wherein the changeover switching operation mode:

(a) comprises at least one switch-on process, in which the load path of each of the first power semiconductor chips is switched from an off state to an on state; and (b) at least one switch-off process, in which the load path of each of the first power semiconductor chips is switched from an on state to an off state.

* * * * *